US006602730B2

(12) United States Patent
Jiang et al.

(10) Patent No.: US 6,602,730 B2
(45) Date of Patent: Aug. 5, 2003

(54) METHOD FOR GRAVITATION-ASSISTED CONTROL OF SPREAD OF VISCOUS MATERIAL APPLIED TO A SUBSTRATE

(75) Inventors: Tongbi Jiang, Boise, ID (US); Syed S. Ahmad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/227,369

(22) Filed: Aug. 23, 2002

(65) Prior Publication Data

US 2002/0197843 A1 Dec. 26, 2002

Related U.S. Application Data

(60) Continuation of application No. 09/849,037, filed on May 4, 2001, now Pat. No. 6,489,681, which is a division of application No. 09/295,709, filed on Apr. 21, 1999, which is a division of application No. 08/709,182, filed on Sep. 6, 1996, now Pat. No. 6,083,768.

(51) Int. Cl.[7] .............................................. H01L 21/48
(52) U.S. Cl. ........................................................ 438/25
(58) Field of Search ............................... 438/25, 26, 51, 438/55, 64, 112, 124, 126, 127

(56) References Cited

U.S. PATENT DOCUMENTS

| | | |
|---|---|---|
| 3,596,136 A | 7/1971 | Fischer |
| 3,721,747 A | 3/1973 | Renskers |
| 3,760,237 A | 9/1973 | Jaffe |
| 4,143,456 A | 3/1979 | Inoue |
| 4,247,864 A | 1/1981 | Lockard |
| 4,300,153 A | 11/1981 | Hayakawa et al. |
| 4,697,203 A | 9/1987 | Sakai et al. |
| 4,769,344 A | 9/1988 | Sakai et al. |
| 4,999,319 A | 3/1991 | Hamano et al. |
| 5,008,213 A | 4/1991 | Kolesar, Jr. |
| 5,286,679 A | 2/1994 | Farnworth et al. |
| 5,346,558 A | 9/1994 | Mathias |
| 5,468,681 A | 11/1995 | Pasch |
| 5,586,715 A | 12/1996 | Schwiebert et al. |
| 5,663,106 A | 9/1997 | Karavakis et al. |
| 5,675,889 A | 10/1997 | Acocella et al. |
| 6,030,889 A | 2/2000 | Aulicino et al. |

OTHER PUBLICATIONS

Okuno, "Unique Epoxy Resin and Printing Encapsulation Systems(PES) for Advanced Multi Chip Module, TAB, COB, and Flip–Chip", *Int. Electronics Packaging Soc.*, pp. 506–518, 1993.

Okuno et al., "Printing Encapsulation Sysems(PES) for Advanced Multichip Module and COB Device", *IEEE Transactions On Components, Packaging, and Manufacturing Technology—Part B*, vol. 17, No. 1, pp. 119–123, Feb. 1994.

Epoxy Technology, Brochure, "Why soldering flip chips is not so hot", 1 page.

Gilleo, "The Printed Package Revolution", *Electronic Packaging & Production*, pp. 81–83, Feb. 1996.

Liang, "Effect of Surface Energies on Screen Printing Resolution", *IEEE Transactions on Components/Packaging, and Manufacturing Technology*, Part B, vol. 19, No. 2, pp. 423–425, May 1996.

*Primary Examiner*—David Nelms
*Assistant Examiner*—Thao P. Le
(74) *Attorney, Agent, or Firm*—TraskBritt

(57) ABSTRACT

A method of forming high definition elements, such as conductive traces on electronic devices or substrates, from or including viscous material. The method includes inverting the electronic components or substrates after the viscous material is applied and maintaining the inverted orientation until the viscous material dries or cures enough to maintain definition of its perimeter and edge characteristics.

11 Claims, 17 Drawing Sheets

METHOD FOR GRAVITATION-ASSISTED CONTROL OF SPREAD OF VISCOUS MATERIAL APPLIED TO A SUBSTRATE

CROSS-REFERENCE TO RELATED APPLICATIONS

This application is a continuation of application Ser. No. 09/849,037, filed May 4, 2001, now U.S. Pat. No. 6,489,681, issued Dec. 3, 2002, which is a divisional of application Ser. No. 09/295,709, filed Apr. 21, 1999, pending, which is a divisional of application Ser. No. 08/709,182, filed Sep. 6, 1996, now U.S. Pat. No. 6,083,768, issued Jul. 4, 2000.

BACKGROUND OF THE INVENTION

1. Field of the Invention

The present invention relates to maintaining the structure of viscous materials applied to semiconductor components. More particularly, the present invention relates to inverting electrical components formed from viscous materials or which include viscous materials in order to maintain the material boundary definition during baking, curing, and/or drying.

2. State of the Art

Higher performance, lower cost, increased miniaturization of components, and greater packaging density of integrated circuits are goals of the computer industry. As components become smaller and smaller, tolerances for all semiconductor structures (circuitry traces, printed circuit board and flip chip bumps, adhesive structures for lead attachment, encapsulation structures, and the like) become more and more stringent. However, because of the characteristics of the materials (generally viscous materials) used in forming the semiconductor structures, it is becoming difficult to form smaller circuitry traces, conductive polymer bumps with closer pitches, adequate adhesive structures for leads attachment, and adequate encapsulation structures.

U.S. Pat. No. 5,286,679 issued Feb. 15, 1994 to Farnworth et al. ("the '679 patent"), assigned to the assignee of the present invention and hereby incorporated herein by reference, teaches attaching leads to a semiconductor device with adhesive in a "lead-over-chip" ("LOC") configuration. The '679 patent teaches applying a patterned thermoplastic or thermoset adhesive layer to a semiconductor wafer. The adhesive layer is patterned to keep the "streets" on the semiconductor wafer clear of adhesive for saw cutting and to keep the wire bonding pads on the individual dice clear of adhesive for wire bonding. Patterning of the adhesive layer is generally accomplished by hot or cold screen/stencil printing or dispensing by roll-on. Following the printing and baking of the adhesive layer on the semiconductor wafer, the individual dice are singulated from the semiconductor wafer. During packaging, each adhesive coated die is attached to leadfingers of a lead frame by heating the adhesive layer and pressing the leadfingers onto the adhesive. If the adhesive layer is formed of a thermoset material, a separate oven cure is required. Furthermore, the adhesive layer may be formulated to function as an additional passivating/insulating layer or alpha barrier for protecting the packaged die.

Although the teaching of the '679 patent is a substantial advancement over previous methods for attaching leads in a LOC configuration, the miniaturization of the circuitry makes it difficult to achieve an adequate profile on the adhesive, such that there is sufficient area on the top of the adhesive to attach the leadfingers. The process disclosed in the '679 patent is illustrated in FIGS. 23–29. FIG. 23 illustrates a side, cross-sectional view of a semiconductor substrate 602 with a bond pad 604, wherein a stencil or a screen print template 606 has been placed over the semiconductor substrate 602. The semiconductor substrate 602 is generally a wafer, although the term as used herein is not so restricted, and other substrate structures including silicon-on-insulator ("SOI") and printed circuit boards ("PCB") are specifically included. The stencil or screen print template 606 is patterned to clear the area around the bond pads 604 and to clear street areas 608 for saw cutting (i.e., for singulating the substrate into individual dice). An adhesive material 610 is applied to the stencil or screen print template 606, as shown in FIG. 24. Ideally, when the stencil or screen print template 606 is removed, adhesive prints 612 are formed with vertical sidewalls 614 and an adhesive material upper surface 616, as shown in FIG. 25. However, since the adhesive material 610 must have sufficiently low viscosity to flow and fill the stencil or screen print template 606, as well as allow for the removal of the stencil or screen print template 606 without the adhesive material 610 sticking thereto, the adhesive material 610 of the adhesive prints 612 will spread, sag, or flow laterally under the force of gravity after the removal of the stencil or screen print template 606, as shown in FIG. 26. This post-application flow of adhesive material 610 can potentially cover all or a portion of the bond pads 604 or interfere with the singulating of the semiconductor wafer by flowing into the street areas 608.

Furthermore, and of even greater potential consequence than bond pad or street interference is the effect that the lateral flow or spread of adhesive material 610 has on the adhesive material upper surface 616. As shown in FIG. 27, the adhesive material upper surface 616 is the contact area for leadfingers 618 of a lead frame 620. The gravity-induced flow of the adhesive material 610 causes the once relatively well-defined edges 622 of the adhesive material to curve, resulting in a loss of surface area 624 (ideal shape shown in shadow) for the leadfingers 618 to attach. This loss of surface area 624 is particularly problematical for the adhesive material upper surface 616 at the adhesive material end 626 thereof. At the adhesive material end 626, the adhesive material flows in three directions (to both sides as well as longitudinally), causing a severe curvature 628, as shown in FIGS. 28 and 29. Stated are three ways the longitudinal ends of the adhesive print on patch flow in a 180E° flow front, resulting in blurring of the print boundaries into a curved perimeter. This curvature 628 results in complete or near complete loss of effective surface area on the adhesive material upper surface 616 for adhering the outermost leadfinger closest to the adhesive material end 626 (leadfinger 630). This results in what is known as a "dangling lead." Since the leadfinger 630 is not adequately attached to the adhesive material end 626, the leadfinger 630 will move or bounce when a wirebonding apparatus (not shown) attempts to attach a bond wire (not shown) between the leadfinger 630 and its respective bond pad 604 (shown from the side in FIG. 28). This movement can cause inadequate bonding or non-bonding between the bond wire and the leadfinger 630, resulting in the failure of the component due to a defective electrical connection.

LOC attachment can also be achieved by placing adhesive material on the leadfingers of the lead frame rather than on the semiconductor substrate. The adhesive material 702 is generally spray applied on an attachment surface 704 of leadfingers 706, as shown in FIG. 30. However, the viscous nature of the adhesive material 702 results in the adhesive material 702 flowing down the sides 708 of the leadfinger 706 and collecting on the reverse, bond wire surface 710 of the leadfinger 706, as shown in FIG. 31. The adhesive material 702, which collects and cures on the bond wire surface 710, interferes with subsequent wirebonding which can result in a failure of the semiconductor component. The flow of adhesive material 702 from the attachment surface 704 to the bond wire surface 710 can be exacerbated if the leadfingers 706 are formed by a stamping process, rather than by etching, the other widely employed alternative. The stamping process leaves a slight curvature 712 to edges 714 of at least one surface of the leadfinger 706, as shown in FIG. 32. If an edge curvature 712 is proximate the leadfinger attachment surface 704, the edge curvature 712 results in less resistance (i.e., less surface tension) to the flow of the adhesive material 702. This, of course, results in the potential for a greater amount of adhesive material 702 to flow to the bond wire surface 710.

Material flow problems also exist in application of encapsulation materials. After a semiconductor device is attached to a printed circuit board ("PCB") by any known chip-on-board ("COB") technique, the semiconductor device is usually encapsulated with a viscous liquid or gel insulative material (e.g., silicones, polyimides, epoxies, plastic, and the like). This encapsulation (depending on its formulation) allows the semiconductor device to better withstand exposure to a wide variety of environmental conditions such as moisture, ions, heat and abrasion.

One technique used in the industry is illustrated in FIGS. 33–35. A stencil 802 is placed on a conductor-carrying substrate or PCB 804 such that an open area or stencil cavity 806 in the stencil 802 exposes a semiconductor device 808 to be encapsulated and a portion of the substrate or PCB 804 surrounding the semiconductor device 808, as shown in FIG. 33. An encapsulant material 810 is then extruded from a nozzle 812 into the stencil cavity 806, as shown in FIG. 34. However, when the stencil 802 is removed, the encapsulant material 810 sags or flows laterally under the force of gravity, as shown in FIG. 35. This flowing thins the encapsulant material 810 on the top surface 814 of the semiconductor device 808, which may result in inadequate protection for the semiconductor device 808. Using a thicker encapsulant material would help minimize the amount of flow; however, thicker encapsulant materials are difficult to extrude through a nozzle and are subject to the formation of voids/air pockets. These voids/air pockets can cause delamination from the PCB 804 or the semiconductor device 808, and if the voids/air pockets contain water condensation, during subsequent processing steps the encapsulant material can be heated to the point at which the condensed water vaporizes, causing what is known as a "popcorn effect" (i.e., a small explosion) which damages (i.e., cracks) the encapsulation material, resulting in at least contamination and usually irreparable damage, effectively destroying the semiconductor device. Furthermore, using encapsulant materials with high thixotropic indexes may result in a concave shape which thins the encapsulant material 810 on the top surface 814 of the semiconductor device 808, which may result in inadequate protection for the semiconductor device 808, as shown in FIG. 36.

In an effort to cope with the encapsulant flow problem, the damming technique shown in FIGS. 37–40 has been used. A high viscosity material 902 is extruded through a nozzle 904 directly onto a substrate or PCB 906 to form a dam 908 around a semiconductor device 910, as shown in FIG. 37, or a stencil 912 can be placed on the substrate and PCB 906, such that a continuous aperture 914 in the stencil 912 exposes an area around the semiconductor device 910 to be dammed, as shown in FIG. 38. The high viscosity material 902 is then disposed in the stencil aperture 914 to form the dam 908. A low viscosity encapsulation material 916 is then extruded into the area bounded by the dam 908 by a second nozzle 918, as shown in FIG. 39. The dam 908 prevents the low viscosity encapsulation material 916 from flowing, to form the dammed encapsulated structure 920 shown in FIG. 40 after curing. The dam 908 can be made with high viscosity material without adverse consequences since it does not directly contact the semiconductor device 910 or form any part, other than a damming function, of the encapsulation of the semiconductor device 910. Although this damming technique is an effective means of containing the low viscosity encapsulation material 916, it requires additional processing steps and additional equipment, which increase the cost of the component.

Material flow problems further exist in forming conductive line and trace materials. As discussed in Liang et al., "Effect of Surface Energies on Screen Printing Resolution," IEEE Transactions on Components, Packaging, and Manufacturing Technology-Part B, Vol. 19, No. 2, May 1996 ("the Liang article"), miniaturization of semiconductor packages results in increased circuit densities which require a proportionate reduction of the width of printed lines and traces on semiconductor substrates. However, there are two conflicting requirements for the conductive material applied in screen printing the printed lines and traces. The first requirement is that the conductive material should have sufficiently low viscosity to remove mesh marks and surface imperfections induced during the printing process. The conflicting requirement is that the conductive material should be sufficiently high in viscosity such that it does not flow excessively (i.e., spread). If the conductive material spreads, parallel lines could contact one another, resulting in a short. The Liang article investigates the influences of surface energies of the substrates and the conductive material on screen printing resolution. The conclusion of the Liang article is to use substrates with low surface energies, such as polymer-based substrates, to decrease the wettability of the conductive material to improve screen printing resolution. However, this approach limits the flexibility of using different substrate material for applications demanding different performance parameters. Furthermore, using polymer-based substrates may not be acceptable in certain applications such as high surface energy ceramic substrate.

Material flow problems further exist in forming conductive bumps on printed circuit boards and flip chips. Solder bumps, also termed "C4" bumps, for Controlled Collapse Chip Connection, are a conventional means for attaching and forming an electrical communication between a flip chip and a substrate or PCB, wherein the solder bumps are formed on the flip chip as a mirror-image of the connecting bond pads on the PCB, or vice versa. The flip chip is bonded to the PCB by reflowing the solder bumps.

State-of-the-art solder bumps are generally made of multiple layers of various metals or metal alloys (e.g., lead, tin, copper), which will achieve an effective, strong and controlled-boundary bond between the substrate/PCB and the flip chip. However, the formation of these layered solder bumps requires a substantial number of processing steps which increase the cost of the component. Furthermore, the solder bumps require a high temperature to reflow during the attachment of the flip chip to the substrate/PCB, which may damage temperature-sensitive components on the semiconductor device. Thus, solder bumps are being replaced by conductive polymer bumps.

As shown in FIG. 43, conductive polymer bumps 1002 are formed on bond pads 1004 on a semiconductor device substrate 1006. Alternatively, the bumps may be applied to a carrier substrate, such as a PCB. The bond pads 1004 are in electrical communication with circuitry (not shown) on or in the semiconductor substrate 1006 via electrical traces 1008 (shown in shadow) in or on the semiconductor substrate 1006. The conductive polymer bumps 1002 are generally formed either by screen printing or stenciling. As shown in FIG. 41, a print screen or stencil 1010 is placed over the semiconductor substrate 1006 with openings 1012 over and aligned with each bond pad 1004. A conductive polymer 1007 is deposited in the openings 1012, as shown in FIG. 42. The print screen or stencil 1010 is then removed to form the conductive polymer bumps 1002, as shown in FIG. 43. The conductive polymer bumps 1002 are generally made from material which is sufficiently viscous that minimal material flow occurs when the print screen or stencil 1010 is removed. However, this self-minimization of flow is only applicable to specific limited ratios of height to width of the conductive polymer bumps 1002. If the height of the conductive polymer bump 1002 is too great relative to the width, the weight of the conductive material will cause the conductive polymer bump 1002 to collapse on itself and flow laterally. Thus, height-to-width ratios approaching the preferred target of 3:1 or greater obtainable with solder bumps are unattainable with present methods. In short, to attain a satisfactory height of the conductive polymer bump 1002, the width of the conductive polymer bump 1002 must be increased proportionately. However, when the conductive polymer bump 1002 width is increased, for a given minimum pitch in spacing between adjacent conductive polymer bumps 1002, bond pad pitch also increases, which takes up more space on the semiconductor substrate 1006, limiting the number and arrangement of the die-to-carrier substrate connections. This is, of course, in conflict with the goal of miniaturizing semiconductor devices of ever-increasing circuit density.

Thus, it can be appreciated that it would be advantageous to develop a technique to control viscous material flow in the formation of semiconductor components while using commercially-available, widely-practiced semiconductor device fabrication techniques.

BRIEF SUMMARY OF THE INVENTION

The present invention relates to a method for maintaining viscous material boundary definition by inverting electrical components formed from viscous materials or which include viscous materials during drying or curing.

The present invention comprises using standard techniques for applying viscous materials (e.g., spin on, spray on, roll on, screen printed, and the like) which form semiconductor device elements, such as circuitry traces, printed circuit board and flip chip bumps, adhesive structures for lead attachment, encapsulation structures, and the like. After application of the viscous materials on a semiconductor or carrier structure, the entire structure is flipped to an inverted position, followed by ambient or elevated temperature drying or curing. Rather than gravitational forces causing the viscous material to flow and expand as when upright and supported from below, the gravitational forces on the inverted semiconductor or carrier structure maintain the shape and boundary definition of the original viscous material formation. It has been found that inverting the semiconductor results in a substantial improvement for wall angles and improvement in the shape and boundary definition of the elements made from the viscous materials.

As a general matter, the entire structure is inverted immediately or as quickly as practical after the application of the viscous material to prevent any substantial spreading of the viscous material. This immediate inversion maximizes the benefit of the present invention by preserving the shape and boundary definition of the viscous material as applied. It is, of course, understood that the viscous material must be capable of adhering to the semiconductor or carrier structure and must not be of such a low viscous that it drips when inverted.

Furthermore, with regard to drying or curing, the structure need only be inverted until the viscous material has stabilized sufficiently to maintain its shape and boundary definition. Depending on the particular viscous material used, the minimum inversion time could be the time required to cure the outer surfaces of the viscous material such that a film is formed which contains the viscous material therein, or the minimum inversion time could be the time required to completely dry or cure the viscous material element.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
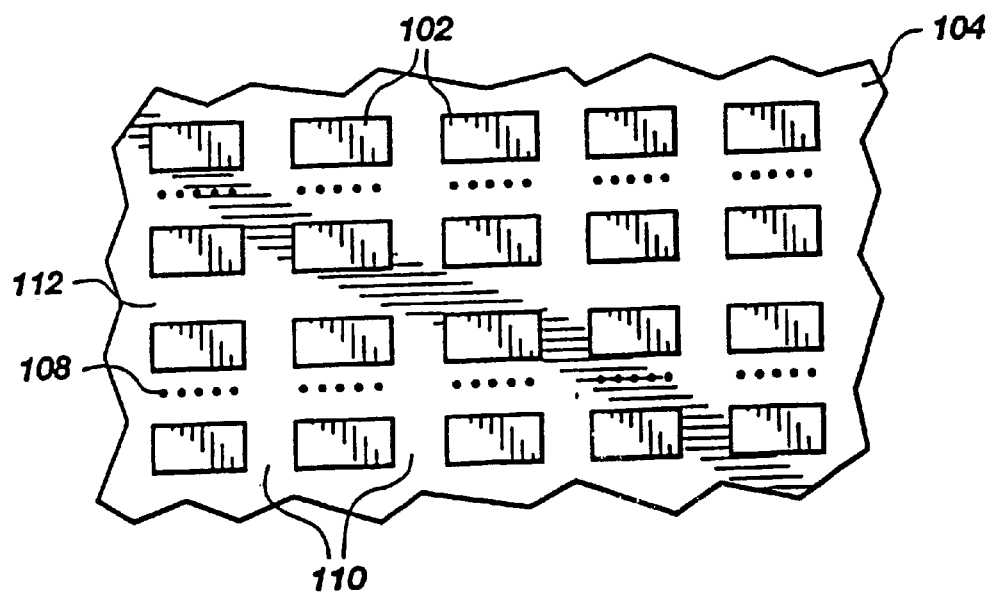
FIGS. 1–5 are a top plan and side cross sectional views of adhesive prints formed by the method of the present invention.

FIGS. 1–5 illustrate forming a rectangular adhesive print 102 on a semiconductor substrate 104. FIG. 1 shows several rectangular adhesive prints 102 uniformly distributed on the semiconductor substrate 104, such as a silicon wafer or SOI substrate. The spaces between the rectangular adhesive prints 102 can have a plurality of bond pads 108 disposed between a pair of rectangular adhesive prints 102. The spaces may also be void of any circuitry or structures to form vertical streets 110 and horizontal streets 112 along which a cutting saw proceeds to sever or singulate the semiconductor substrate 104 into individual semiconductor dice.

Figure 2:
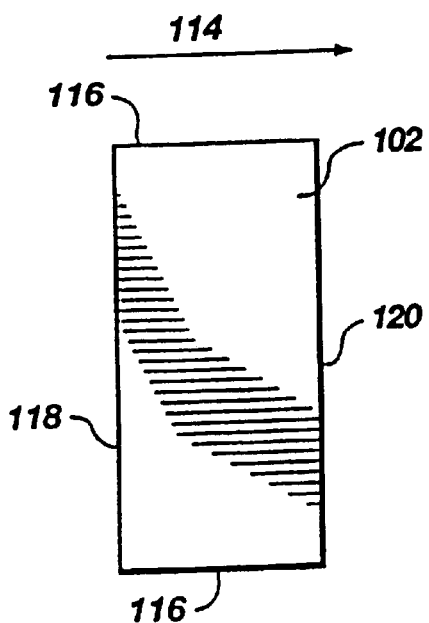
Figure 24:
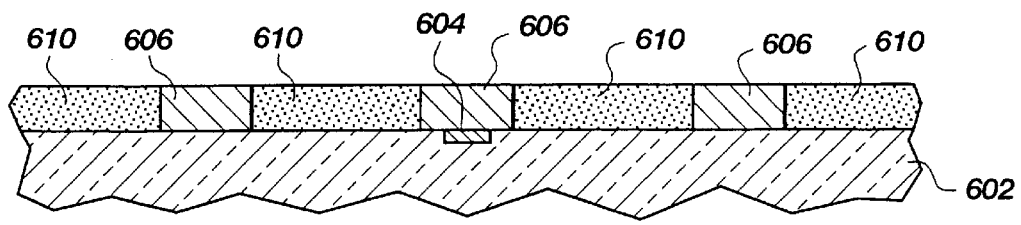
Figure 25:
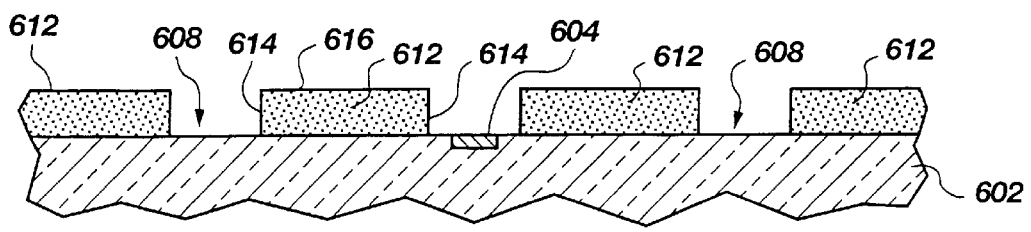
Figure 26:
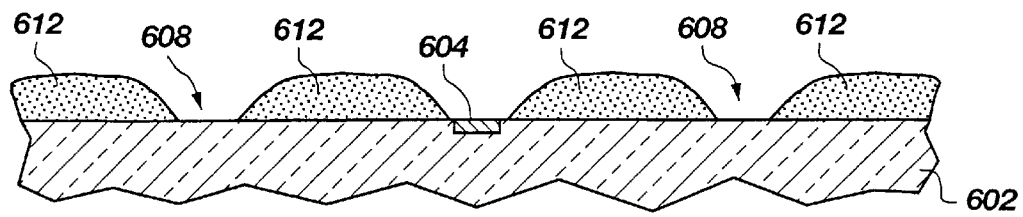
Figure 27:
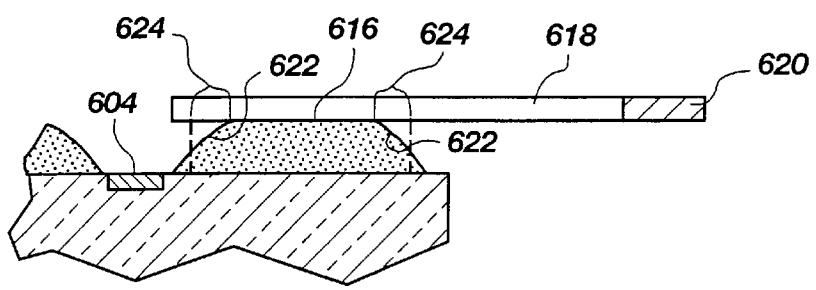
Figure 28:
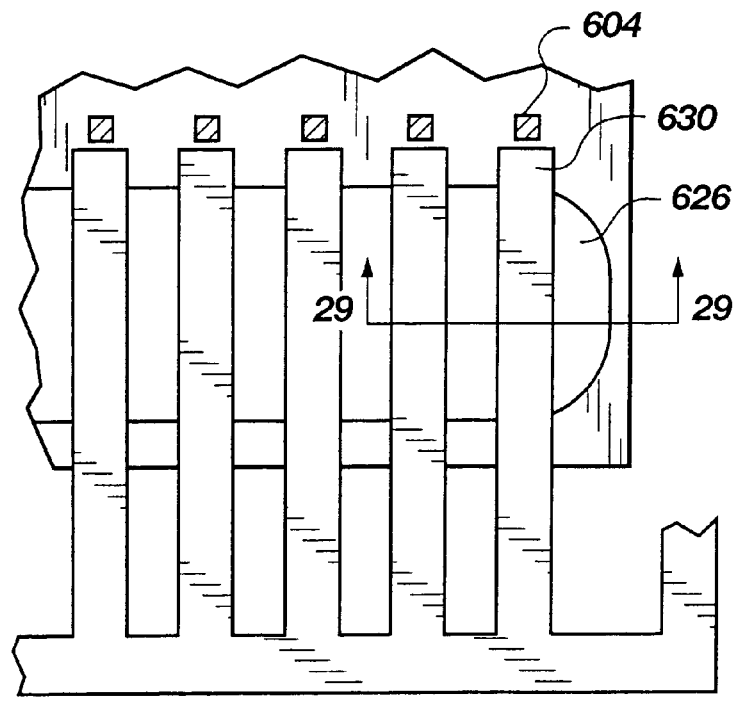
Figure 29:
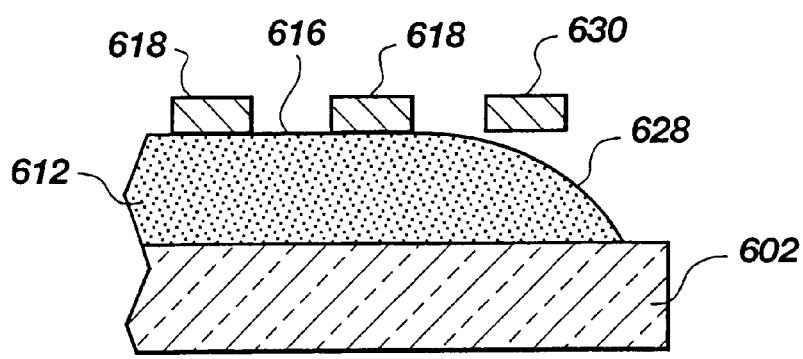
Figure 30:
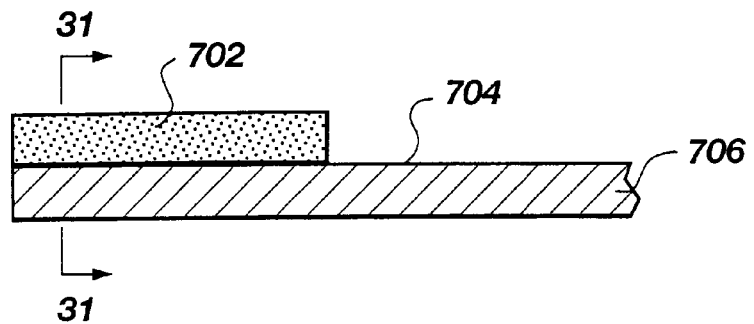
FIGS. 30–32 are side cross-sectional views of a technique of forming adhesive areas on leadfingers for LOC attachment.
Figure 31:
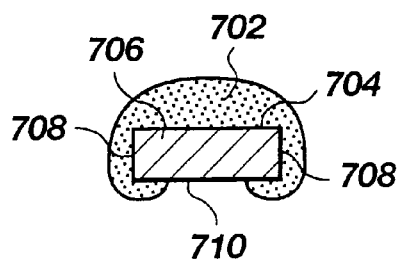
Figure 32:
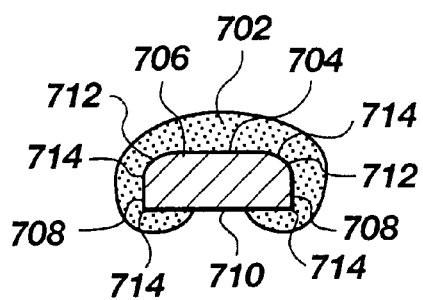

The rectangular adhesive prints 102 are generally formed in the manner discussed above for the '679 patent illustrated in FIGS. 23–28. Referring to FIG. 24, when the adhesive material 610, such as thermoplastic adhesive materials including polyimides and thermosetting adhesive materials including phenolic resins, is applied to the stencil or screen print template 606, an adhesive material dispensing means, such as a spray nozzle, moves across the stencil or screen print template 606. Thus, as shown in FIG. 2, the adhesive material dispensing means moves in direction 114 forming the adhesive print 102 with two lateral edges 116 parallel with direction 114, and a trailing edge 118 and a leading edge 120 which are perpendicular with respect to direction 114.

Figure 3:
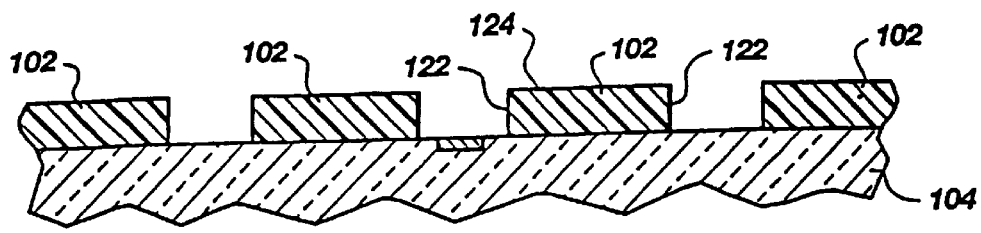
Figure 4:
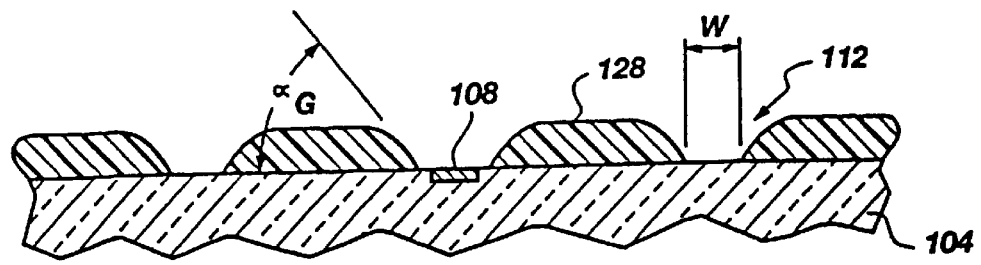

As shown in FIG. 3, when the stencil or screen print template (shown in FIG. 24) is removed, the adhesive prints 102 are ideally formed with vertical sidewalls 122 and a planar upper surface 124. However, as previously discussed, the material forming the adhesive prints 102 must have sufficiently low viscosity to flow and fill the stencil or screen print template, as well as to allow for the removal of the stencil or screen print template without the material forming the adhesive print 102 sticking to the stencil or screen print template and thus being lifted off the semiconductor substrate 104. Thus, the adhesive print 102 will flow laterally under the force of gravity after the removal of the stencil or screen print template, as shown in FIG. 4. This flow of the adhesive print 102 can potentially cover a portion of the bond pads 108 or interfere with the singulating of the semiconductor wafer by flowing into the street areas 110, 112. This results in shortening street width W and decreasing gravity-reduced wall angle ($\alpha_G$), which eventually creates problems with dicing the wafer, inference with bond pads, and dangled leadfingers (due to loss of surface area on a leadfinger attachment surface 128 on the adhesive print 102), as previously discussed.

Figure 5:
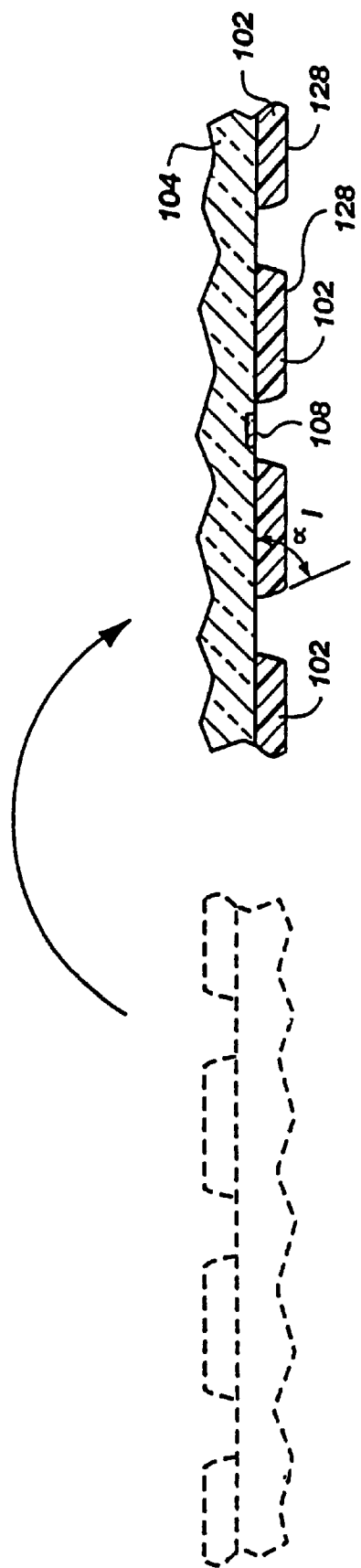

The present invention inverts the semiconductor substrate 104 shortly after removal of the stencil or screen print template, as shown in FIG. 5. The inversion of the semiconductor substrate 104 results in gravitational force assisting in containing the flow and expansion of the adhesive prints 102 during drying or curing. The inversion of the semiconductor substrate 104 results in higher, inversion-contained wall angles ($\alpha_I$) (also known as the "angle of repose"), wider street width W, and a greater surface area on the leadfinger attachment surface 128.

Figure 6:
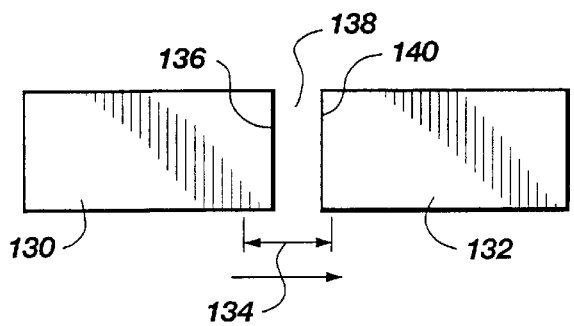
FIGS. 6–8 are schematic and graphical representations of experimental results comparing the lateral edges of an adhesive print formed by a prior art method and the method of the present invention.
Figure 7:
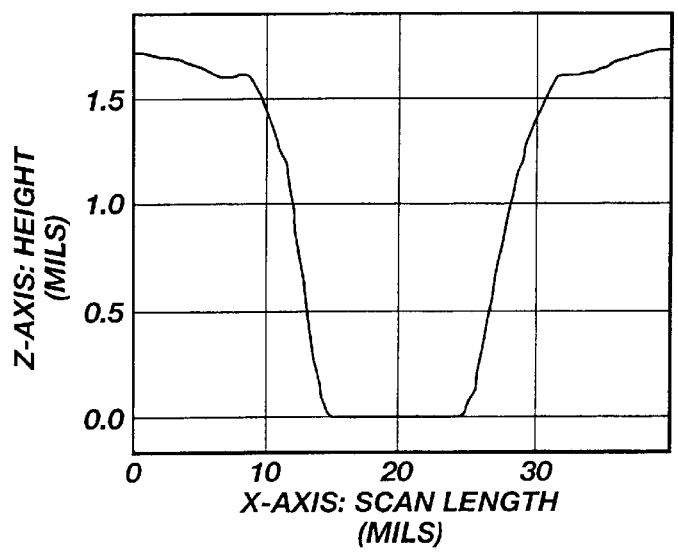
Figure 8:
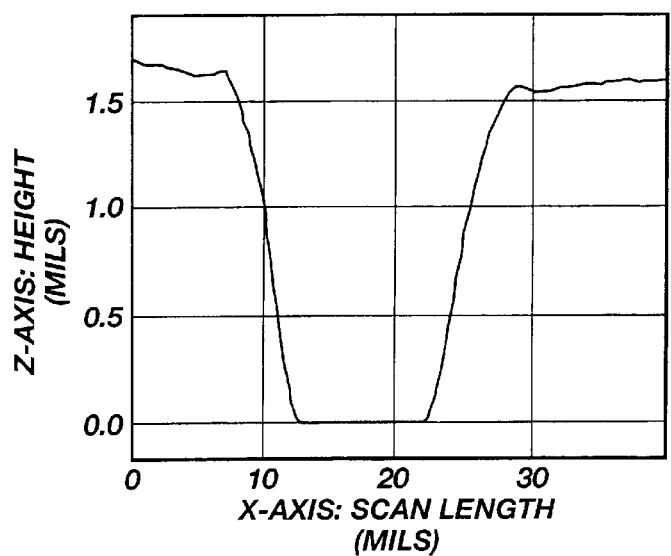

Experimental results have demonstrated that angles of the leading edge, trailing edge and lateral edges of printed adhesives were increased and the top surface area was also increased. FIGS. 6–8 illustrate the profile of the lateral edges 116. FIG. 6 illustrates the scan direction across two adjacent adhesive prints, a first adhesive print 130 and a second adhesive print 132. The scan 134 for the profiles shown in FIGS. 7 and 8 starts near lateral edge 136 of the first adhesive print 130, extends across the gap 138 between the first adhesive print 130 and the second adhesive print 132, and ends after a lateral edge 140 of the second adhesive print 132. It is noted that the z-axis (height) scales of FIGS. 7 and 8 have been expanded in a twenty (20) to one (1) ratio from the x-axis (scan length) scales to better show the details of the profiles. FIG. 7 shows a profile of the scan 134 of the first adhesive print 130 and the second adhesive print 132 formed by a conventional non-inversion method. FIG. 8 shows a profile of the scan 134 of the first adhesive print 130 and the second adhesive print 132 which were formed by the inversion method of the present invention. FIGS. 7 and 8 show that the lateral edge angles of repose have increased from $\alpha_G$ of 18.4 degrees (lateral edge 136) and 18.0 degrees (lateral edge 140) for the non-inversion method to $\alpha_I$ of 22 degrees (lateral edge 136) and 20.6 degrees (lateral edge 140) for the inversion method of the present invention.

Figure 9:
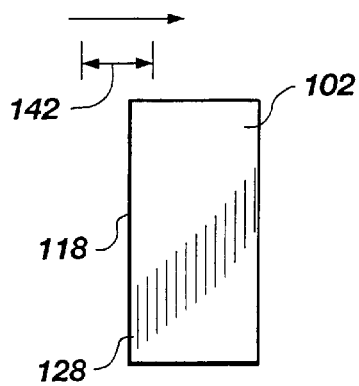
FIGS. 9–11 are schematic and graphical representations of experimental results comparing the trailing edge of an adhesive print formed by a prior art method and the method of the present invention.
Figure 10:
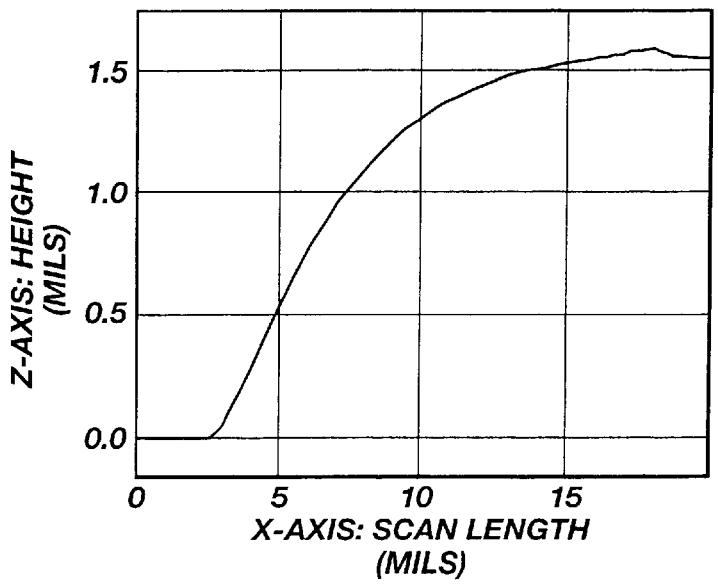
Figure 11:
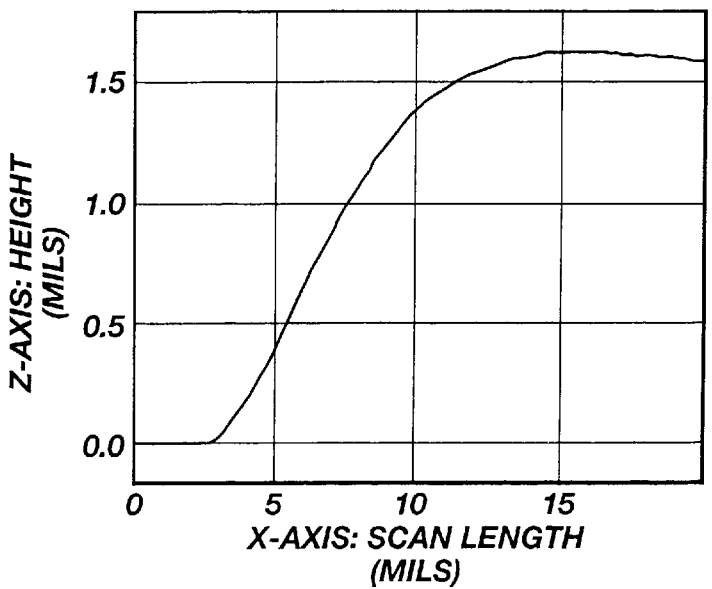

FIGS. 9–11 illustrate the profile of the trailing edge 118. FIG. 9 illustrates the scan direction across the adhesive print 102. The scan 142 for the profiles shown in FIGS. 10 and 11 starts prior to the trailing edge 118 of the adhesive print 102 and ends on the leadfinger attachment surface 128 of the adhesive print 102. It is noted that the z-axis (height) scales of FIGS. 10 and 11 have been expanded in a ten (10) to one (1) ratio from the x-axis (scan length) scales to better show the details of the profiles. FIG. 10 shows a profile of the scan 142 of the trailing edge 118 formed by a conventional non-inversion method. FIG. 11 shows a profile of the scan 142 of the trailing edge 118 formed by the inversion method of the present invention. FIGS. 10 and 11 show that the trailing edge angle of repose has increased from $\alpha_G$ of 9.0 degrees for the non-inversion method to $\alpha_G$ of 13.5 degrees for the inversion method of the present invention.

Figure 12:
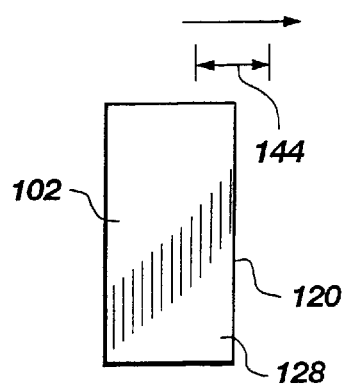
FIGS. 12–14 are schematic and graphical representations of experimental results comparing the leading edge of an adhesive print formed by a prior art method and the method of the present invention.
Figure 13:
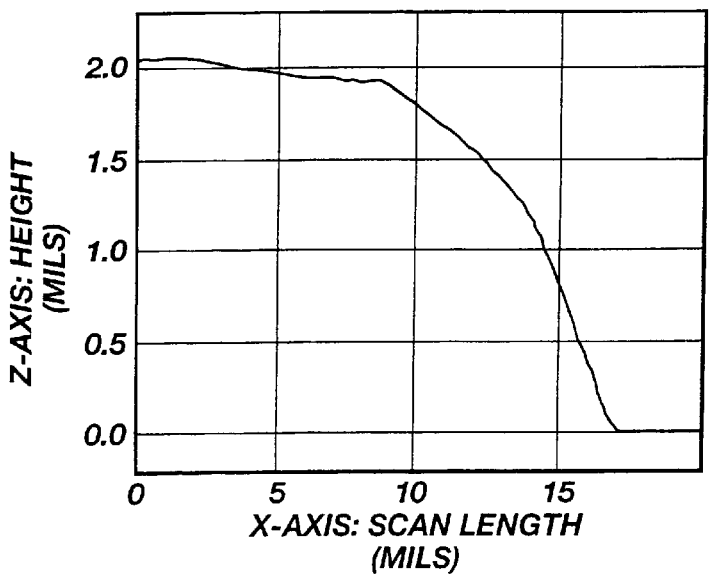
Figure 14:
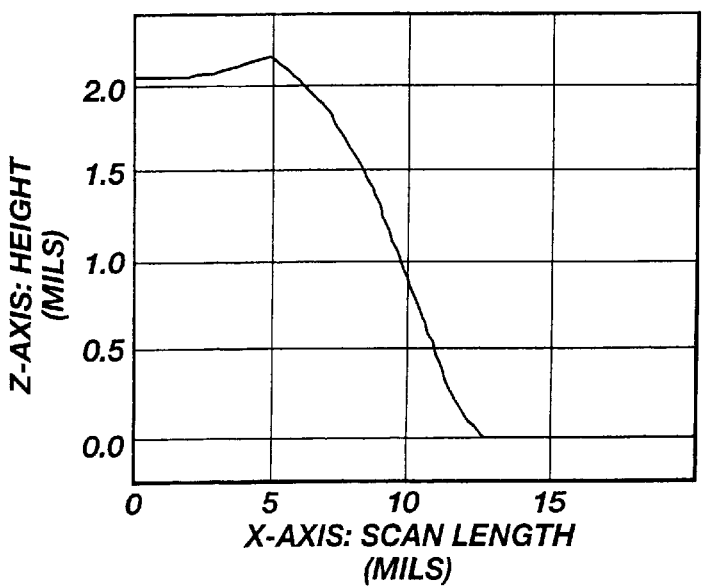

FIGS. 12–14 illustrate the profile of the leading edge 120. FIG. 12 illustrates the scan direction across the adhesive print 102. The scan 144 for the profiles shown in FIGS. 13 and 14 starts on the leadfinger attachment surface 128 of the adhesive print 102 and ends past the leading edge 120 of the adhesive print 102. It is noted that the z-axis (height) scales of FIGS. 13 and 14 have been expanded in a ten (10) to one (1) ratio from the x-axis (scan length) scales to better show the details of the profiles. FIG. 13 shows a profile of the scan 144 of the leading edge 120 formed by a conventional non-inversion method. FIG. 14 shows a profile of the scan 144 of the leading edge 120 formed by the inversion method of the present invention. FIGS. 13 and 14 show that the leading edge angle of repose has increased from 15.9 degrees for the non-inversion method to 22.6 degrees for the inversion method of the present invention.

From these scans it was also determined that the level surface length within the adhesive print between the lateral edges 116 increased 2 to 4 mils. Although the angles and definition increases from these scans are specifically for Ablestick® XR-41395-10 with a viscosity of 40,000 cps, thixotropic index of 3.6, and a baking profile of 30 minutes at 125° C., 30 minutes at 200° C., and 30 minutes ramping from 200° C. to 245° C., comparable results have been achieved for OxyChem® 2421-A6-sp 7495-128B with a viscosity of 46,000 cps, thixotropic index of 1.35, and a baking profile of 60 minutes at 120° C. and 180 minutes at 190° C. Thus, the graphs shown in FIGS. 6–14 illustrate the general improvement trend which will be achieved through the use of the present invention.

Figure 15:
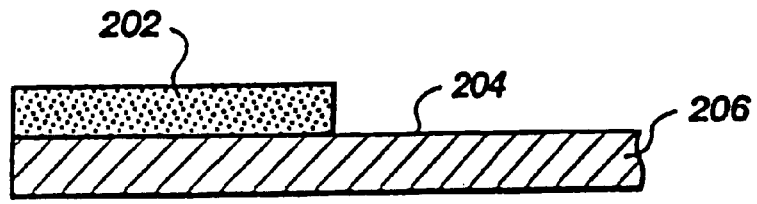
FIGS. 15–17 are cross-sectional views of an adhesive coated lead finger of a LOC semiconductor assembly formed by the inversion method of the present invention.
Figure 16:
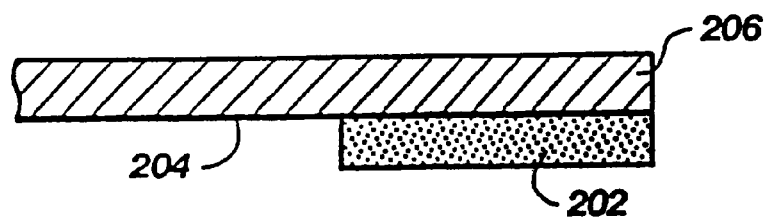
Figure 17:
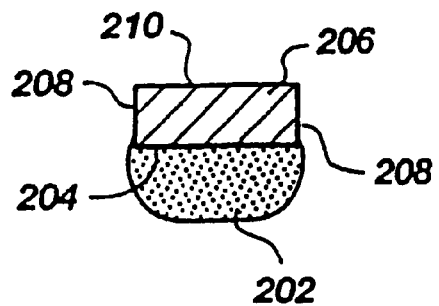

As shown in FIGS. 15–17, adhesive coated leadfingers for LOC attachment can be formed by the inversion method of the present invention. An adhesive material 202 is applied, generally by spray application, on an attachment surface 204 of a leadfinger 206, as shown in FIG. 15. After application of the adhesive material 202, the leadfinger 206 is inverted, as shown in FIG. 16. By inverting the leadfinger 206, the adhesive material 202 will not flow down the sides 208 of the leadfinger 206 and, of course, will not collect on the bond wire surface 210 of the leadfinger 206, as shown in FIG. 17. Since the adhesive material 202 does not collect on the bond wire surface 210, there will be no adhesive material 202 to interfere with the wirebonding step subsequent to LOC attachment of the active surface of the die to the leads.

Figure 18:
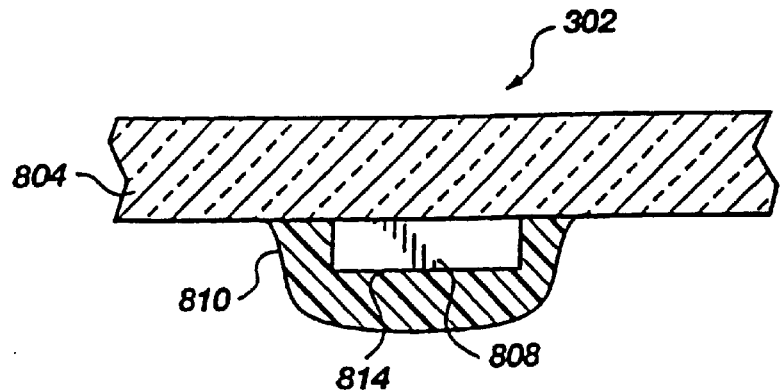
FIG. 18 is a cross-sectional view of an encapsulated semiconductor device formed by the inversion method of the present invention.
Figure 33:
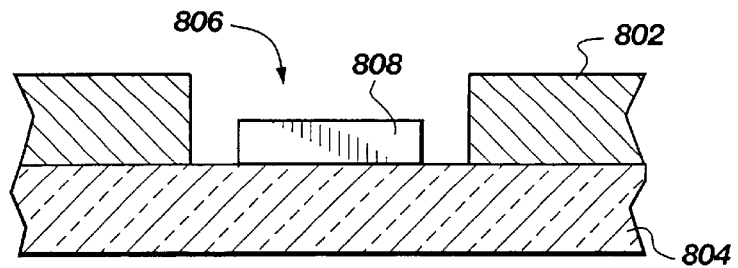
FIGS. 33–35 are side cross-sectional views of a technique of forming an encapsulant layer on a semiconductor device.
Figure 34:
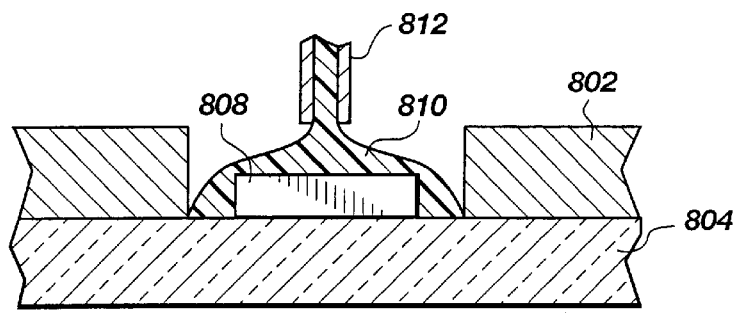
Figure 35:
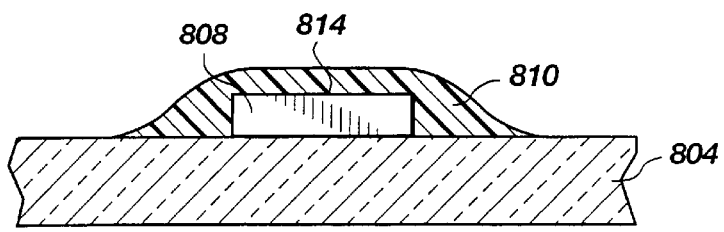
Figure 36:
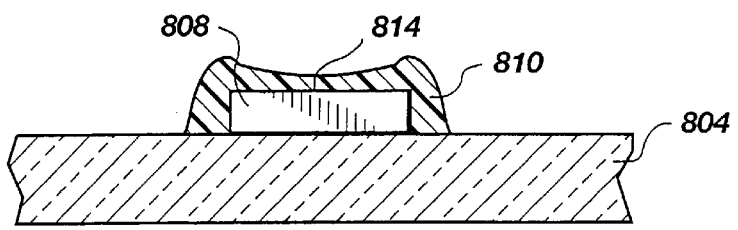
FIG. 36 is a side cross-sectional view of an encapsulated semiconductor device with a concave shaped cured encapsulant.
Figure 37:
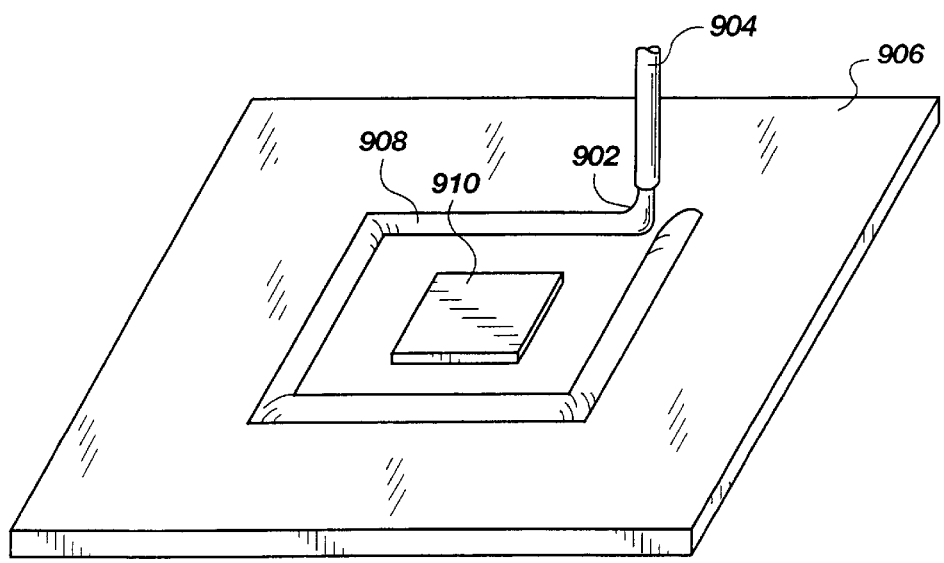
FIGS. 37–40 are oblique views of techniques of forming an encapsulant layer on a semiconductor device using high viscosity material dams.
Figure 38:
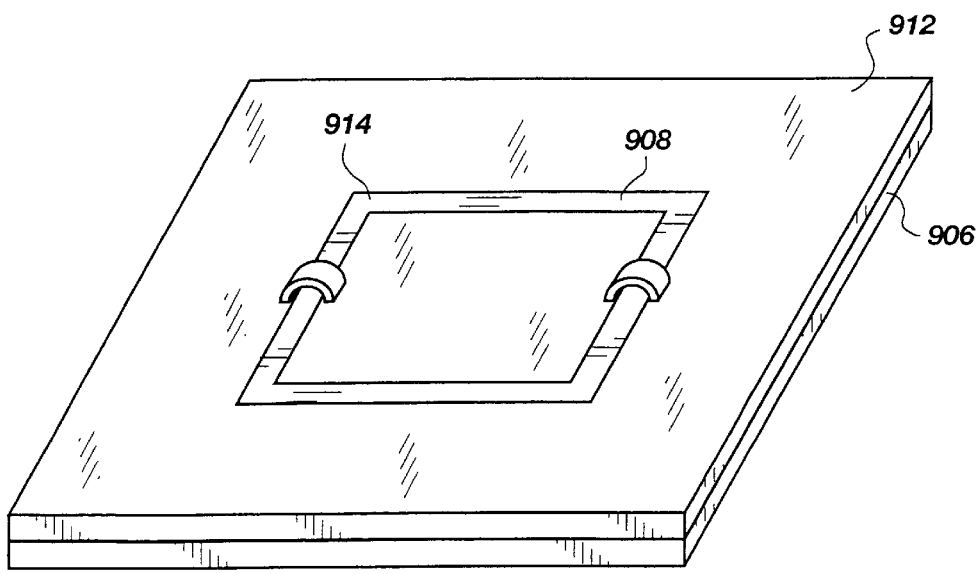
Figure 39:
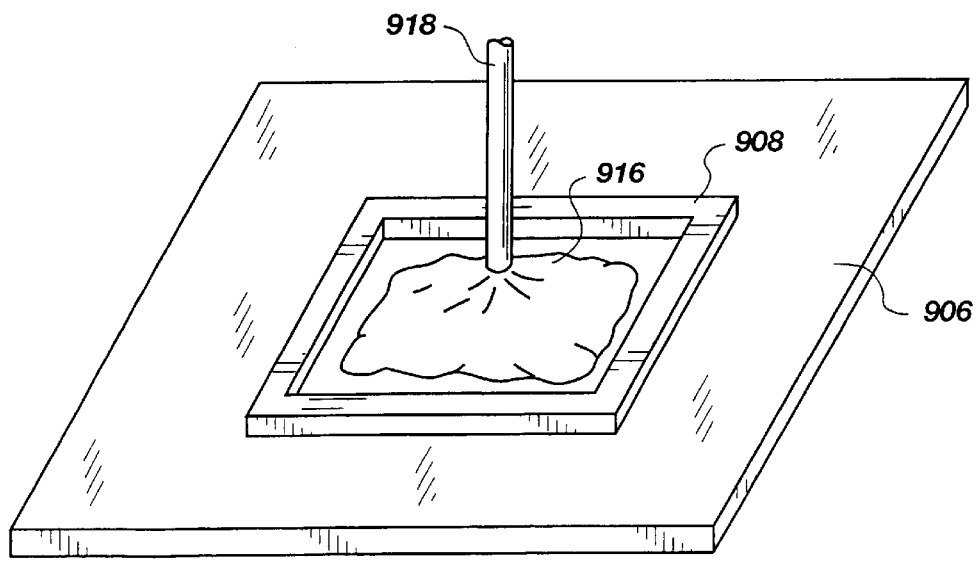
Figure 40:
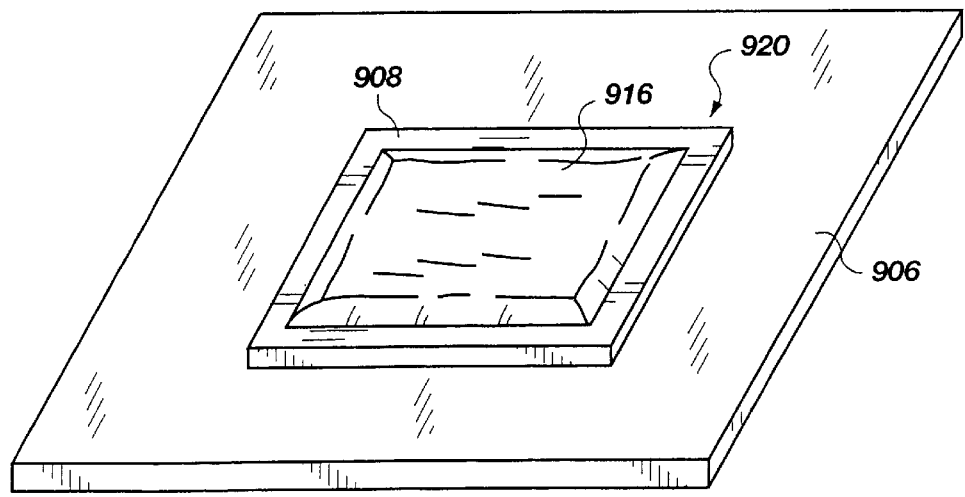

FIG. 18 illustrates an encapsulated semiconductor device 302 made by the inversion method of the present invention. As discussed above and illustrated in FIGS. 33–36, a stencil 802 is placed on a conductive-carrying substrate, such as a PCB 804, such that a cavity 806 in the stencil 802 exposes a semiconductor device 808 to be encapsulated and a portion of the substrate or PCB 804 surrounding the semiconductor device 808, as shown in FIG. 33. An encapsulant material 810, such as silicone, polyimide, urethane, acrylic, epoxy, plastic, and the like, is then extruded from a nozzle 812 into the stencil open area 806, as shown in FIG. 34. When the stencil 802 is removed, the substrate or PCB 804 is inverted to prevent the encapsulant material 810 from spreading or flowing laterally under the force of gravity. By preventing the flow of the encapsulant material 810, the encapsulant material 810 on the top surface 814 of the semiconductor device 808 remains thick enough to provide adequate protection for the semiconductor device 808.

Figure 19:
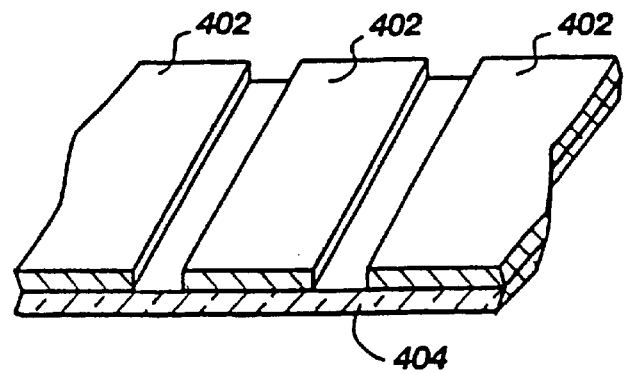
FIGS. 19–21 are oblique views of the formation of traces on a semiconductor substrate by the method of the present invention.
Figure 20:
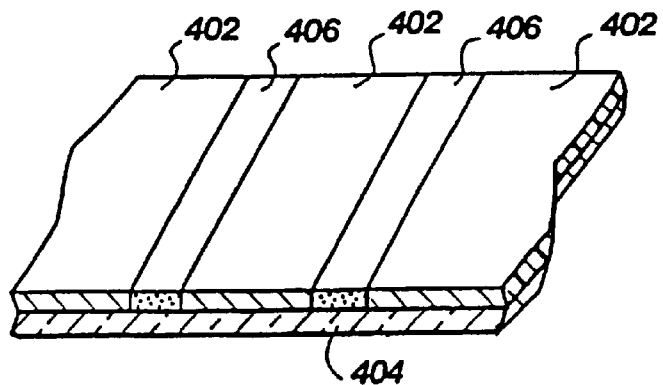
Figure 21:
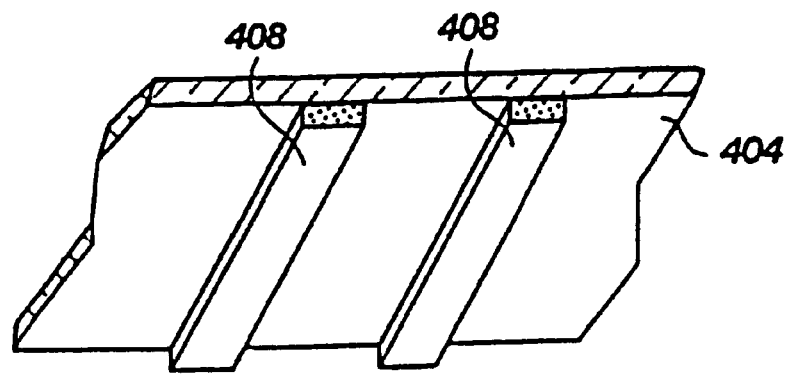

FIGS. 19–21 illustrate the formation of traces on a semiconductor substrate by the method of the present invention. A stencil or print screen 402 with an appropriate trace design is placed over a semiconductor substrate 404, as shown in FIG. 19. A conductive material 406 is applied to the stencil or print screen 402, as shown in FIG. 20. The stencil or print screen 402 is then removed leaving conductive traces 408, and the semiconductor substrate 404 is inverted during the drying or curing of the conductive traces 408, as shown in FIG. 21. Since the conductive material 406 is prevented from flowing laterally by the inversion of the semiconductor substrate 404, the distance between parallel conductive traces 408 can be reduced, resulting in a reduction of the size of the semiconductor substrate.

Figure 22:
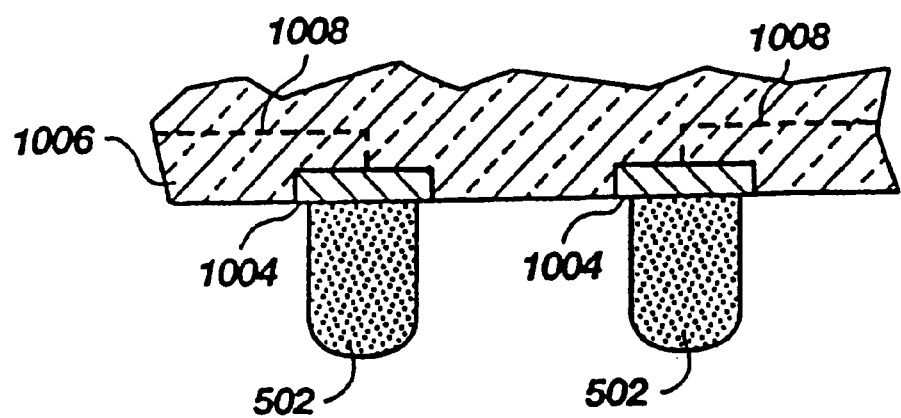
FIG. 22 is a side cross-sectional view of a conductive polymer bump formed by the method of the present invention.
Figure 23:
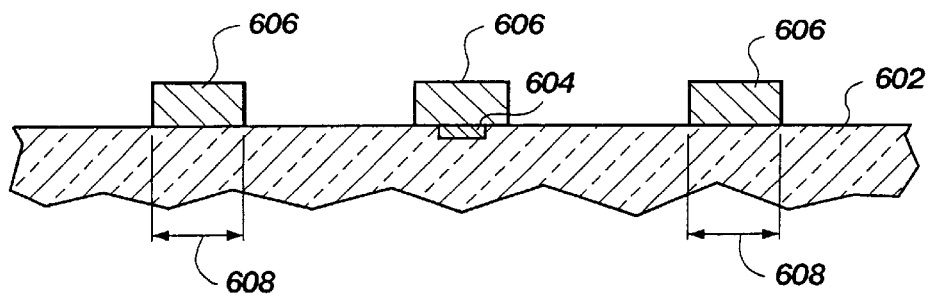
FIGS. 23–29 are side cross-sectional views of a technique of forming adhesive areas on a substrate for LOC attachment.
Figure 41:
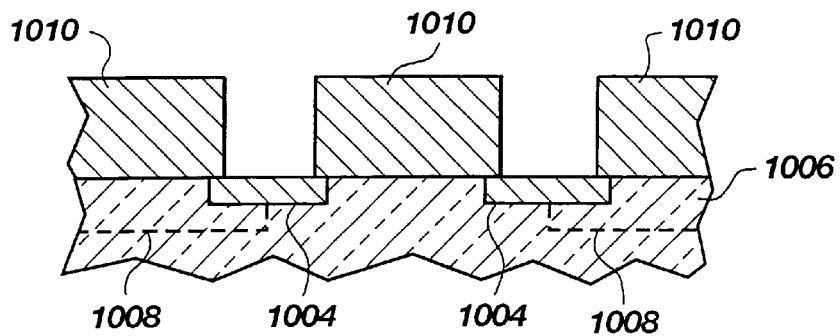
FIGS. 41–43 are side cross-sectional views of a technique of forming conductive polymer bumps on a substrate.
Figure 42:
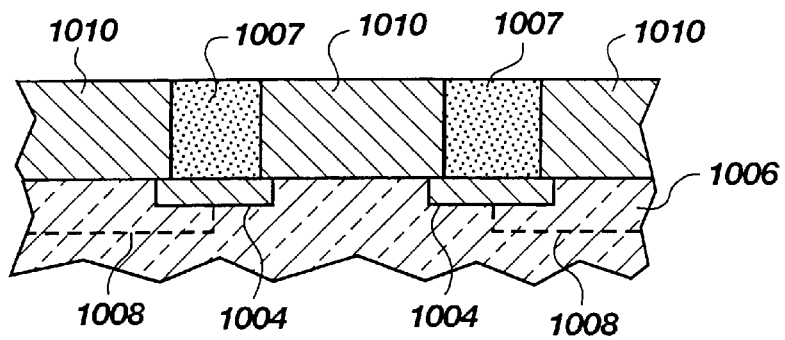
Figure 43:
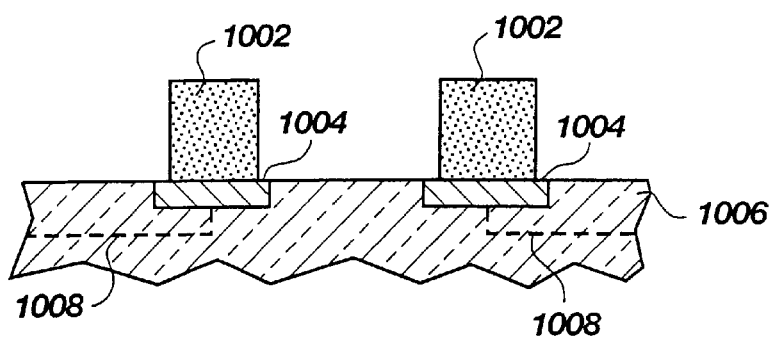

FIG. 22 illustrates conductive polymer bumps 502 formed by the method of the present invention. As previously discussed and illustrated in FIGS. 41–43, the conductive polymer bumps 1002 are generally formed on bond pads 1004 on the surface of a semiconductor substrate 1006. The bond pads 1004 are in electrical communication with integrated circuitry (not shown) on or in the semiconductor substrate 1006 via electrical traces 1008 in or on the semiconductor substrate 1006. As shown in FIG. 41, a print screen or stencil 1010 is placed over the semiconductor substrate 1006 with openings 1012 over each bond pad 1004. The conductive polymer 1007 is deposited in the openings 1012, as shown in FIG. 42. The print screen or stencil 1010 is removed and the semiconductor substrate 1006 inverted to maintain the definition of the conductive polymer bumps 502, as shown in FIG. 22. With the present invention, the conductive polymer bumps 502 can achieve height to width ratios of the preferred target of 3:1 or greater, since the weight of the polymer material causing the conductive polymer bump 502 to collapse on itself and flow or spread is no longer an issue. It is also understood that the inversion method of the present invention could also be used in the formation of metallic conductive bumps.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming at least one conductive trace on a substrate, comprising:

depositing a viscous conductive material on a substrate in a pattern of at least one conductive trace;

inverting the substrate such that the viscous conductive material is suspended below the substrate; and suspending the viscous conductive material below the substrate until the viscous conductive material obtains a defined lateral boundary that is substantially resistant to flow.

2. The method according to claim 1, wherein depositing a viscous conductive material on a substrate in a pattern of at least one conductive trace comprises:

providing a template having at least one aperture in a shape of the pattern of the at least one conductive trace;

placing the template on the substrate;

depositing the viscous conductive material into the at least one aperture; and removing the template.

3. The method according to claim 2, wherein the template is selected to be one of a stencil and a screen print template.

4. The method according to claim 2, wherein removing the template comprises removing the template prior to inverting the substrate.

5. The method according to claim 1, wherein the substrate is selected to be a semiconductor substrate.

6. The method according to claim 1, wherein the substrate is selected to be a printed circuit board.

7. The method according to claim 1, wherein suspending the viscous conductive material below the substrate until the viscous conductive material obtains a defined lateral boundary that is substantially resistant to flow comprises at least partially hardening the viscous conductive material by curing or drying.

8. The method according to claim 7, further comprising at least partially hardening the viscous conductive material at an ambient temperature surrounding the substrate.

9. The method according to claim 7, further comprising at least partially hardening the viscous conductive material at a temperature elevated above an ambient temperature surrounding the substrate.

10. The method according to claim 7, wherein at least partially hardening the viscous conductive material by curing or drying comprises:

suspending the viscous conductive material for a period of time sufficient for a hardened film to form on an outer surface of the viscous conductive material; and returning the substrate to a non-inverted position while the hardened film encloses non-hardened viscous conductive material.

11. The method according to claim 7, wherein at least partially hardening the viscous conductive material by curing or drying comprises:

suspending the viscous conductive material for a period of time sufficient to completely harden the viscous conductive material; and returning the substrate to a non-inverted position.

* * * * *

UNITED STATES PATENT AND TRADEMARK OFFICE
CERTIFICATE OF CORRECTION

PATENT NO. : 6,602,730 B2
APPLICATION NO. : 10/227369
DATED : August 5, 2003
INVENTOR(S) : Tongbi Jiang and Syed S. Ahmad It is certified that error appears in the above-identified patent and that said Letters Patent is hereby corrected as shown below:

On the title page:
In ITEM (54) "Title," 1st line    change "METHOD FOR GRAVITATION-ASSISTED" to --METHOD FOR GRAVITATIONALLY ASSISTED--

In the drawings:
In FIG. 41,    insert two occurrences of reference numeral --1012-- with associated arrow-pointed lead lines depicting open area over bond pads (as shown below)

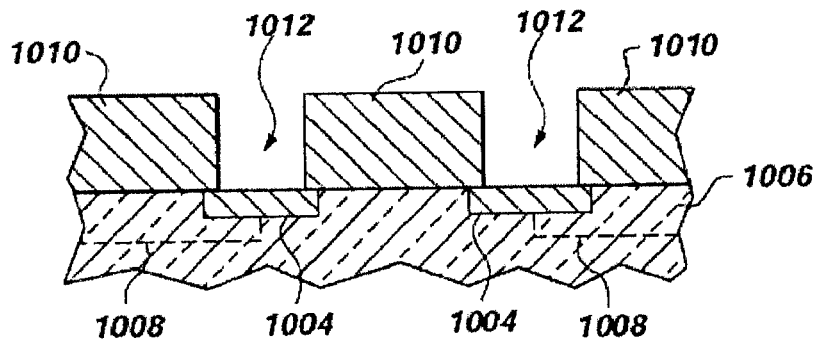

Fig. 41
(PRIOR ART)

In the specification:
COLUMN 1,    LINE 1,    change "METHOD FOR GRAVITATION-ASSISTED" to --METHOD FOR GRAVITATIONALLY ASSISTED--

UNITED STATES PATENT AND TRADEMARK OFFICE
CERTIFICATE OF CORRECTION

PATENT NO. : 6,602,730 B2
APPLICATION NO. : 10/227369
DATED : August 5, 2003
INVENTOR(S) : Tongbi Jiang and Syed S. Ahmad It is certified that error appears in the above-identified patent and that said Letters Patent is hereby corrected as shown below:

COLUMN 2, LINE 44, change "a 180E° flow" to --a 180° flow--
COLUMN 6, LINE 7, change "low viscous" to --low viscosity--

Signed and Sealed this

Seventeenth Day of June, 2008

JON W. DUDAS
*Director of the United States Patent and Trademark Office*